United States Patent
Oda

(10) Patent No.: US 12,295,129 B2
(45) Date of Patent: May 6, 2025

(54) MODULE HAVING A SHIELD FILM AND METHOD OF MANUFACTURING THE SAME

(71) Applicant: Murata Manufacturing Co., Ltd., Kyoto-fu (JP)

(72) Inventor: Tetsuya Oda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 179 days.

(21) Appl. No.: 18/153,051

(22) Filed: Jan. 11, 2023

(65) Prior Publication Data

US 2023/0141689 A1    May 11, 2023

Related U.S. Application Data

(63) Continuation of application No. PCT/JP2021/024982, filed on Jul. 1, 2021.

(30) Foreign Application Priority Data

Jul. 17, 2020   (JP) .................. 2020-122853

(51) Int. Cl.
  *H05K 1/18*    (2006.01)
  *H05K 3/28*    (2006.01)
  (Continued)

(52) U.S. Cl.
  CPC ............... *H05K 9/00* (2013.01); *H05K 1/181* (2013.01); *H05K 3/284* (2013.01); *H05K 3/303* (2013.01);
  (Continued)

(58) Field of Classification Search
  CPC ............. H05K 1/181; H05K 2203/107; H05K 2203/1322; H05K 9/0022; H05K 9/00;
  (Continued)

(56) References Cited

U.S. PATENT DOCUMENTS

| | | | |
|---|---|---|---|
| 2009/0126984 A1* | 5/2009 | Saneto ................. | H05K 9/0096 174/350 |
| 2015/0043170 A1* | 2/2015 | Shimamura ............ | H05K 3/284 361/728 |

(Continued)

FOREIGN PATENT DOCUMENTS

| JP | 2015-057802 A | 3/2015 |
|---|---|---|
| JP | 2019-080029 A | 5/2019 |

(Continued)

OTHER PUBLICATIONS

International Search Report for PCT/JP2021/024982 dated Sep. 7, 2021.

*Primary Examiner* — James Wu
*Assistant Examiner* — Dakota M Talbert
(74) *Attorney, Agent, or Firm* — McDonald Hopkins LLC

(57) ABSTRACT

A module includes a substrate including a first surface, a first component mounted on the first surface, at least a part of which is covered with a first conductive film, a sealing resin arranged to cover the first surface and the first component, and a shield film that covers a part of a surface of the sealing resin on a side distant from the substrate. The surface of the sealing resin on the side distant from the substrate includes a shielded region covered with the shield film when viewed in a direction perpendicular to the first surface and a non-shielded region not covered with the shield film. The non-shielded region is superimposed on at least a part of the first conductive film.

11 Claims, 7 Drawing Sheets

(51) Int. Cl.
  *H05K 9/00*   (2006.01)
  *H05K 3/30*   (2006.01)
(52) U.S. Cl.
  CPC ............... *H05K 2201/0707* (2013.01); *H05K 2201/10371* (2013.01)
(58) Field of Classification Search
  CPC ........... H05K 3/284; H05K 2201/0707; H05K 2201/10371; G09G 2330/06
  See application file for complete search history.

(56) References Cited

U.S. PATENT DOCUMENTS

| | | |
|---|---|---|
| 2017/0338031 A1 | 11/2017 | Miyahara |
| 2019/0122993 A1 | 4/2019 | Kim et al. |
| 2019/0311994 A1* | 10/2019 | Hong ..................... H01L 21/56 |
| 2019/0341353 A1 | 11/2019 | Han et al. |
| 2020/0043866 A1 | 2/2020 | Fujii et al. |
| 2020/0137931 A1* | 4/2020 | Lee ..................... H05K 9/0031 |

FOREIGN PATENT DOCUMENTS

| | | |
|---|---|---|
| JP | 2019-195034 A | 11/2019 |
| JP | 6624026 B2 | 12/2019 |
| WO | 2018/194012 A1 | 10/2018 |

\* cited by examiner

MODULE HAVING A SHIELD FILM AND METHOD OF MANUFACTURING THE SAME

CROSS REFERENCE TO RELATED APPLICATION

This is a continuation of International Application No. PCT/JP2021/024982 filed on Jul. 1, 2021 which claims priority from Japanese Patent Application No. 2020-122853 filed on Jul. 17, 2020. The contents of these applications are incorporated herein by reference in their entireties.

TECHNICAL FIELD

The present disclosure relates to a module and a method of manufacturing the same.

BACKGROUND ART

With increase in number of components in the inside of an electronic device such as a smartphone and reduction in size and a lower profile of the electronic device in recent years, noise interference between electronic components included in the electronic device gives rise to a problem. In order to prevent noise interference, use of a shield film in a communication module product has been demanded. For example, Japanese Patent Laying-Open No. 2015-57802 (PTL 1) describes a circuit module including a shield film. This circuit module includes a sealing body composed of an insulating resin, and a shield film is provided to cover an outer surface of the sealing body. For forming such a shield film, a method such as plating or sputtering is generally used.

In a single module, a plurality of electronic components may be mounted on an identical substrate, and noise interference between different electronic components on the identical substrate may also give rise to a problem. In order to suppress such noise interference between the electronic components, as described, for example, in Japanese Patent No. 6624026 (PTL 2), an electronic component in such a structure that a shield film is provided on an upper surface and a side surface of the electronic component itself (which is referred to as a "shield-film-equipped electronic component" below) has also been proposed.

PTL 1: Japanese Patent Laying-Open No. 2015-57802
PTL 2: Japanese Patent No. 6624026

BRIEF SUMMARY

In referring to a "shield-film-equipped electronic component" below, the term "shield film" is used. An element like a shield film provided on the outer surface of the electronic component, however, is not necessarily grounded and it may also serve as some kind of an interconnection.

A module can be constructed by mounting a shield-film-equipped electronic component on a substrate, providing resin sealing to cover the shield-film-equipped electronic component, and forming a shield film over an upper surface of the sealing resin. When an upper surface of the shield-film-equipped electronic component is not sufficiently distant from the upper surface of the sealing resin, a signal may propagate between the shield film formed on the upper surface of the electronic component and the shield film provided on the upper surface of the sealing resin of the module, which may lead to failure in obtaining a desired characteristic.

In general, a shield film provided on an outer surface of a sealing resin of a module is designed to be grounded by such a method as electrical connection to a ground line exposed at a side surface of a substrate, and by being grounded, it exhibits a shielding effect. The shield film provided on the outer surface of the shield-film-equipped electronic component, on the other hand, is not necessarily grounded, and it is also often used as a part of a wiring for L or C. In that case, the shield film provided on the outer surface of the shield-film-equipped electronic component is different in potential from the shield film provided on the outer surface of the sealing resin of the module. Therefore, a parasitic capacitance may be caused between the shield film provided on the outer surface of the shield-film-equipped electronic component and the shield film provided on the outer surface of the sealing resin of the module. Occurrence of such a parasitic capacitance is also a factor for lowering in performance as the module.

Even when the shield film provided on the outer surface of the shield-film-equipped electronic component is grounded, a parasitic capacitance may be caused as below. The principles of shielding are to make a noise signal flow to a ground electrode through a shield film which is a conductive film at a low resistivity, and the shield film ideally has a resistance of 0. Actually, however, the shield film has a certain resistivity. Therefore, the noise signal cannot completely flow away, the potential as the shield film does not attain to an ideal ground potential, and the potential varies with the noise signal. When the module handles a high frequency, a phase difference of noise depending on a location is noticeable, and hence influence by the phase difference of the potential may be exhibited at a distant location. For such reasons, the parasitic capacitance may be caused between the shield film provided on the outer surface of the shield-film-equipped electronic component and the shield film provided on the outer surface of the sealing resin of the module.

The present disclosure provides a module capable of suppressing occurrence of a parasitic capacitance between a shield film provided in a shield-film-equipped electronic component and a shield film provided on a surface of a sealing resin of the module and a method of manufacturing the same.

The present disclosure includes a substrate including a first surface, a first component mounted on the first surface, at least a part of a surface of which on a side distant from the substrate in a direction perpendicular to the first surface is covered with a first conductive film, a sealing resin arranged to cover the first surface and the first component, and a shield film that covers a part of a surface of the sealing resin on the side distant from the substrate in the direction perpendicular to the first surface. The surface of the sealing resin on the side distant from the substrate includes a shielded region covered with the shield film when viewed in the direction perpendicular to the first surface and a non-shielded region not covered with the shield film, and the non-shielded region is superimposed on at least a part of the first conductive film. The surface of the sealing resin on the side distant from the substrate can include a groove so as to separate the shielded region and the non-shielded region from each other.

According to the present disclosure, the surface of the sealing resin on the side distant from the substrate includes the non-shielded region not covered with the shield film, and the non-shielded region is superimposed on at least a part of the first conductive film of the first component. Therefore, occurrence of a parasitic capacitance between the shield film provided in the shield-film-equipped electronic component and the shield film provided on the surface of the sealing resin of the module can be suppressed.

DETAILED DESCRIPTION

Figure 1:
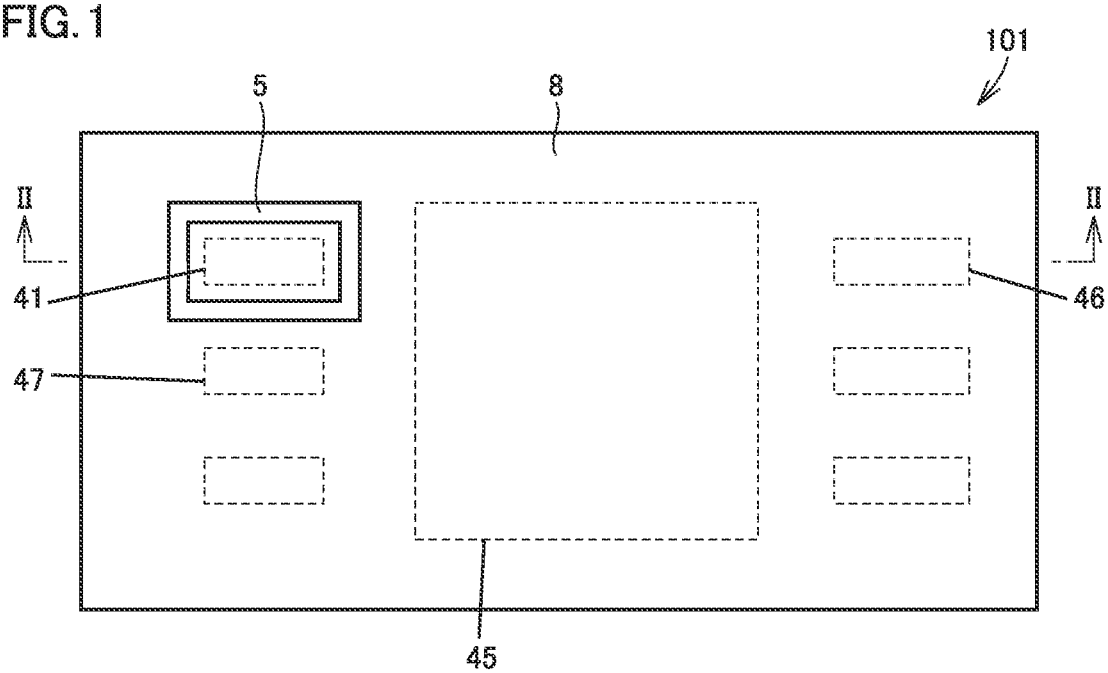
FIG. 1 is a plan view of a module in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

A module in a first embodiment based on the present disclosure will be described with reference to FIGS. 1 to 2.

Figure 2:
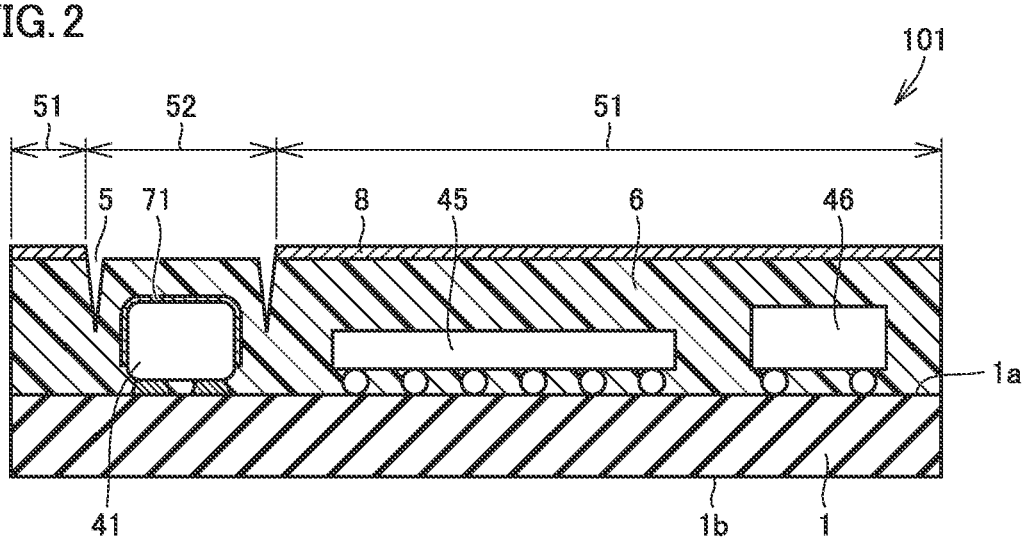
FIG. 2 is a cross-sectional view along the line II-II in FIG. 1.

FIG. 1 shows a plan view of a module 101 in the present embodiment. FIG. 2 shows a cross-sectional view along the line II-II in FIG. 1.

Module 101 in the present embodiment includes a substrate 1 including a first surface 1a, a first component 41 mounted on first surface 1a, at least a part of a surface of which on a side distant from substrate 1 in a direction perpendicular to first surface 1a is covered with a first conductive film 71, a sealing resin 6 arranged to cover first surface 1a and first component 41, and a shield film 8 that covers a part of a surface of sealing resin 6 on the side distant from substrate 1 in the direction perpendicular to first surface 1a. Substrate 1 includes a second surface 1b as a surface opposite to first surface 1a. Substrate 1 may be a resin substrate or a ceramic substrate. Substrate 1 may be a multilayer substrate. In other words, substrate 1 may be a resin multilayer substrate or a ceramic multilayer substrate. First component 41 includes first conductive film 71.

The surface of sealing resin 6 on the side distant from substrate 1 includes a shielded region 51 covered with shield film 8 when viewed in the direction perpendicular to first surface 1a and a non-shielded region 52 not covered with shield film 8. Non-shielded region 52 is superimposed on at least a part of first conductive film 71. The surface of sealing resin 6 on the side distant from substrate 1 can include a groove 5 that separates shielded region 51 and non-shielded region 52 from each other. When viewed in cross-section, groove 5 is in a tapered shape and decreases in width toward a deeper portion. For example, as shown in FIG. 2, groove 5 may be provided to a position deeper than an upper surface of first component 41.

Shield film 8 may be, for example, a film formed by sputtering. Shield film 8 may be in a layered structure composed of a plurality of layers. Shield film 3 may be, for example, in a three-layered structure. Shield film 8 may be in a three-layered structure including, for example, an adhesive layer, a conductive layer, and a protective layer. The adhesive layer may be formed, for example, of SUS, Ti, Cr, Ni, or the like. The conductive layer may be formed, for example, of Cu. The protective layer may be formed, for example, of SUS, Ti, Ni, or the like.

In the present embodiment, non-shielded region 52 is a region not covered with shield film 8. Therefore, even when at least a part of first conductive film 71 is in such positional relation as being superimposed on non-shielded region 52, no parasitic capacitance is caused.

First component 41 as the shield-film-equipped electronic component includes first conductive film 71 as the shield film in this module 101, and occurrence of the parasitic capacitance between this shield film and the shield film provided on the surface of the sealing resin of the module can be suppressed. Therefore, deterioration of characteristics by the parasitic capacitance can be suppressed.

(Manufacturing Method)

Figure 3:
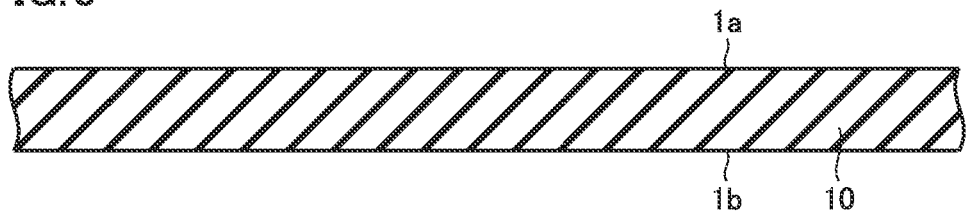
FIG. 3 is an illustrative view of a first step in a method of manufacturing a module in the first embodiment based on the present disclosure.
Figure 4:
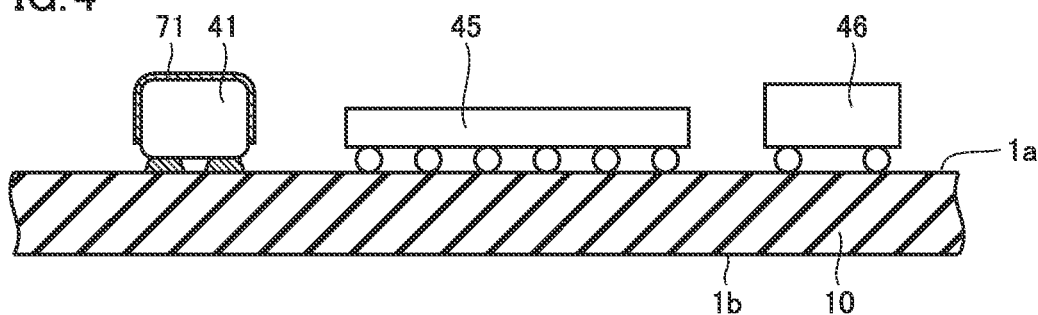
FIG. 4 is an illustrative view of a second step in the method of manufacturing a module in the first embodiment based on the present disclosure.

A method of manufacturing a module in the present embodiment will be described with reference to FIGS. 3 to 11. Initially, as shown in FIG. 3, a substrate 10 is prepared. Substrate 10 is a substrate having a large size corresponding to a plurality of modules. Substrate 10 is also called a "substrate assembly." Substrate 10 includes first surface 1a and second surface 1b as the surface opposite to first surface 1a. Then, as shown in FIG. 4, first component 41 is mounted on first surface 1a of substrate 10. At this time, another component may also be mounted as suitable. In FIG. 4, components 45 and 46 are also mounted by way of example. Though illustration is provided with attention being paid to a portion corresponding to a single module, a component is mounted in a region corresponding to each module, because substrate 10 is the substrate assembly. Though single-sided mount is shown, double-sided mount may be applicable. In other words, a component may be mounted also on second surface 1b.

Figure 5:
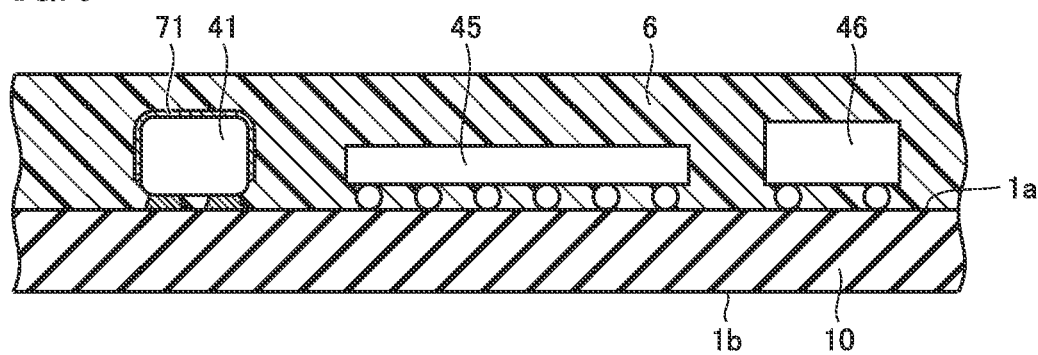
FIG. 5 is an illustrative view of a third step in the method of manufacturing a module in the first embodiment based on the present disclosure.

As shown in FIG. 5, sealing resin 6 is formed. Sealing resin 6 is formed to cover first surface 1a and a component mounted on first surface 1a. In order to form sealing resin 6, such a method as transfer molding, compression molding, dipping of a liquid resin, or the like can be adopted. Though single-sided mount is shown, in double-sided mount, another sealing resin is formed to cover second surface 1b and a component mounted on second surface 1b.

A character, a sign, or a mark may be provided on the upper surface of sealing resin 6. It may be inscribed by laser machining, or may be printed, for example, by such a method as an ink jet method.

Figure 6:
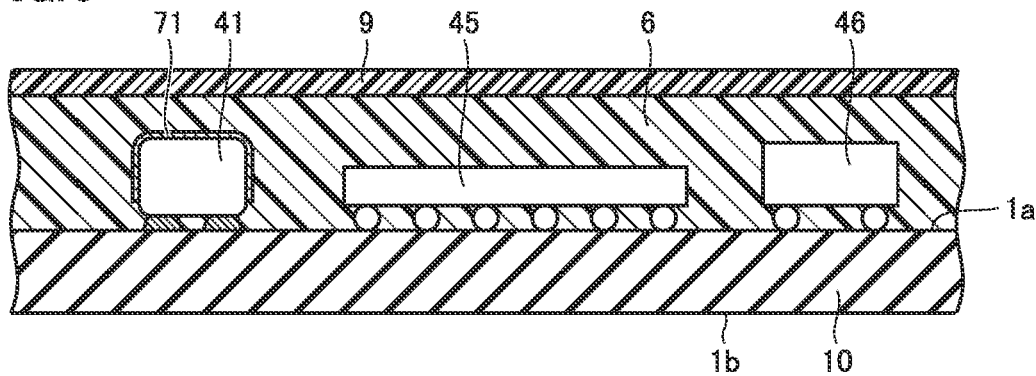
FIG. 6 is an illustrative view of a fourth step in the method of manufacturing a module in the first embodiment based on the present disclosure.

As shown in FIG. 6, a sheet 9 is bonded to the upper surface of sealing resin 6. The entire upper surface of sealing resin 6 is covered with sheet 9. Sheet 9 may be a protective tape. Sheet 9 may be a single-sided adhesive tape.

Figure 7:
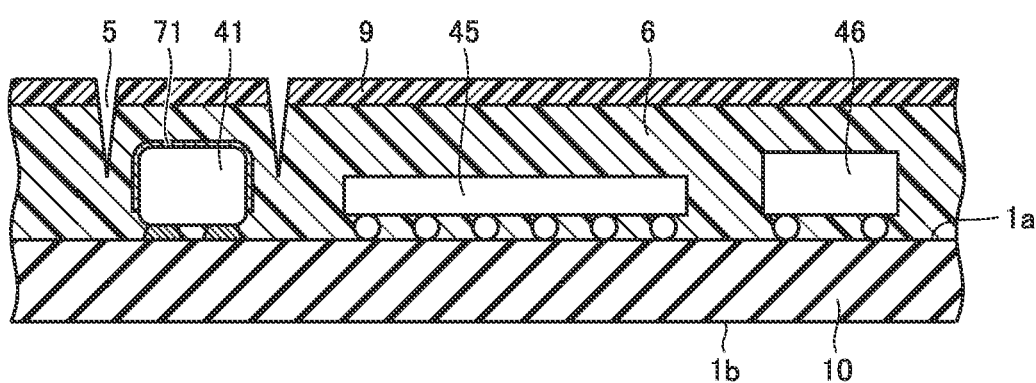
FIG. 7 is an illustrative view of a fifth step in the method of manufacturing a module in the first embodiment based on the present disclosure.

As further shown in FIG. 7, groove 5 is provided in sealing resin 6 from above sheet 9. Groove 5 can be provided, for example, by laser machining. Groove 5 in a shape at a high aspect ratio is provided.

Figure 8:
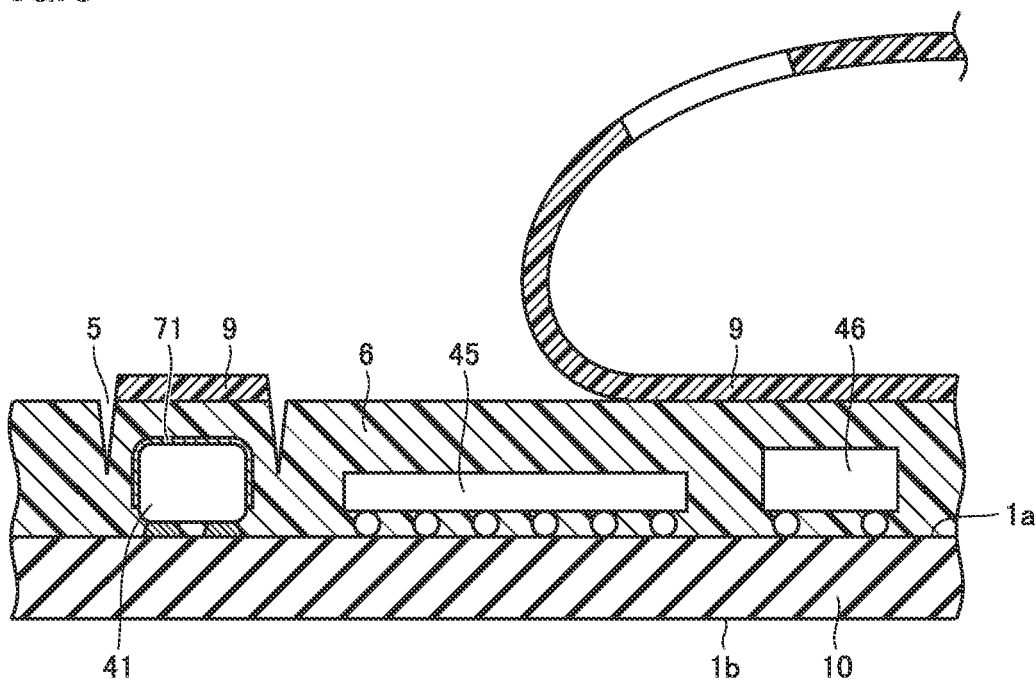
FIG. 8 is an illustrative view of a sixth step in the method of manufacturing a module in the first embodiment based on the present disclosure.
Figure 9:
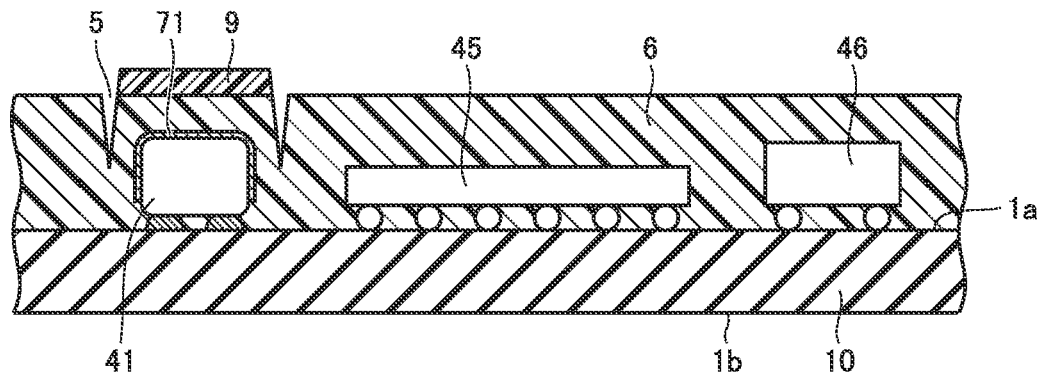
FIG. 9 is an illustrative view of a seventh step in the method of manufacturing a module in the first embodiment based on the present disclosure.

As shown in FIG. 8, sheet 9 in a region to be a shielded region is removed. As shown in FIG. 8, sheet 9 may be peeled off. Since sheet 9 located in a region corresponding to first component 41 is separated by groove 5 from sheet 9 in other portions, it remains on the upper surface of sealing resin 6 even when sheet 9 in other portions is peeled off. Consequently, a state as shown in FIG. 9 is obtained.

Figure 10:
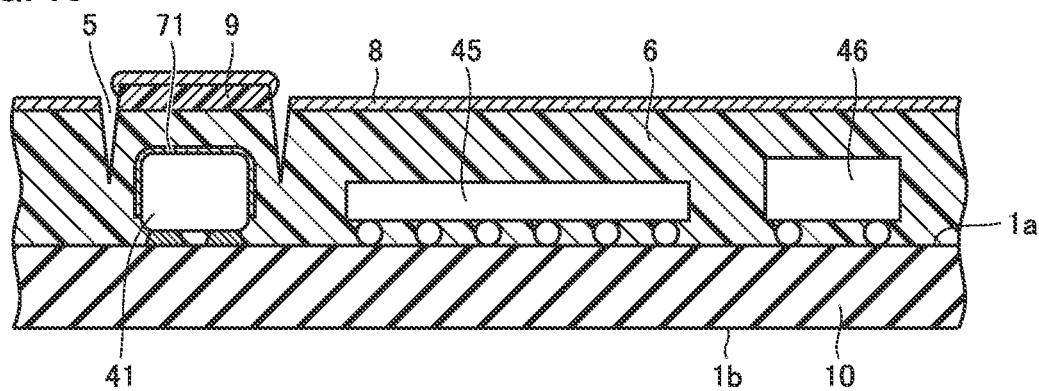
FIG. 10 is an illustrative view of an eighth step in the method of manufacturing a module in the first embodiment based on the present disclosure.

Shield film 8 is formed to cover the upper surface of sealing resin 6. For forming shield film 8, such a method as sputtering, spraying, or the like can be used. At this time, in the region where sheet 9 remains, shield film 8 is formed to cover an upper surface of sheet 9. A part of a side surface of sheet 9 may be covered with shield film 8. Thus, a construction as shown in FIG. 10 is obtained. At the bottom of groove 5, a region not covered with shield film 8 is present. Shield films 8 on the left and right with groove 5 lying therebetween are separate from each other. Shield films 8 on the left and right with groove 5 lying therebetween are electrically isolated from each other. In the example shown in FIG. 10, the side surface of groove 5 is not covered with shield film 8, however, the side surface of groove 5 may be covered with shield film 8. When shield film 8 is formed to cover a part or the entirety of the side surface of groove 5, leakage of noise generated from an electronic component such as first component 41 or a wiring or an electrode of the substrate can be suppressed.

In an example where shield film 8 is composed of a plurality of layers, a film is formed a plurality of times. In forming shield film 8 by spraying, a diagonally spraying method may be adopted so as not to form shield film 8 on a bottom of groove 5.

Figure 11:
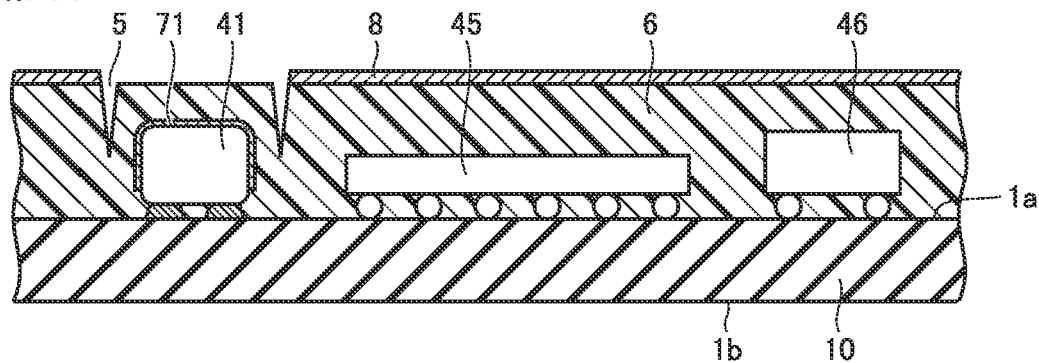
FIG. 11 is an illustrative view of a ninth step in the method of manufacturing a module in the first embodiment based on the present disclosure.

Furthermore, sheet 9 that has remained only above first component 41 is removed. In order to remove sheet 9, for example, another adhesive tape stronger in adhesive force than sheet 9 may be attached to the upper surface of shield film 8 and then peeled off. Thus, sheet 9 is also peeled off from sealing resin 6 as being attached to another adhesive tape. As a result of removal of sheet 9, a construction as shown in FIG. 11 is obtained.

Then, the substrate assembly is divided into substrates each having a size of an individual module. Substrate 10 is divided into substrates 1. For this division, a known technique, such as a dicer, laser, scribing, or the like can be used. The construction as shown in FIG. 2 is thus obtained. Thereafter, as suitable, a product is cleaned, measured, externally inspected, and packed.

A method of manufacturing a module will be summarized below with reference to the description above.

A method of manufacturing a module includes preparing a substrate assembly including a first surface, mounting a first component on the first surface, forming a sealing resin to cover the first surface and the first component, bonding a sheet to cover a surface of the sealing resin on a side distant from the first surface, providing a groove in the sealing resin from above the sheet to surround the first component when viewed in a direction perpendicular to the first surface, removing the sheet in a region other than a region surrounded by the groove, dividing the substrate assembly and the sealing resin into a size of an individual module, forming a shield film to cover an upper surface and a side surface of the sealing resin of the size of the individual module, and removing the sheet that has covered the region surrounded by the groove after the forming a shield film.

Second Embodiment

Figure 12:
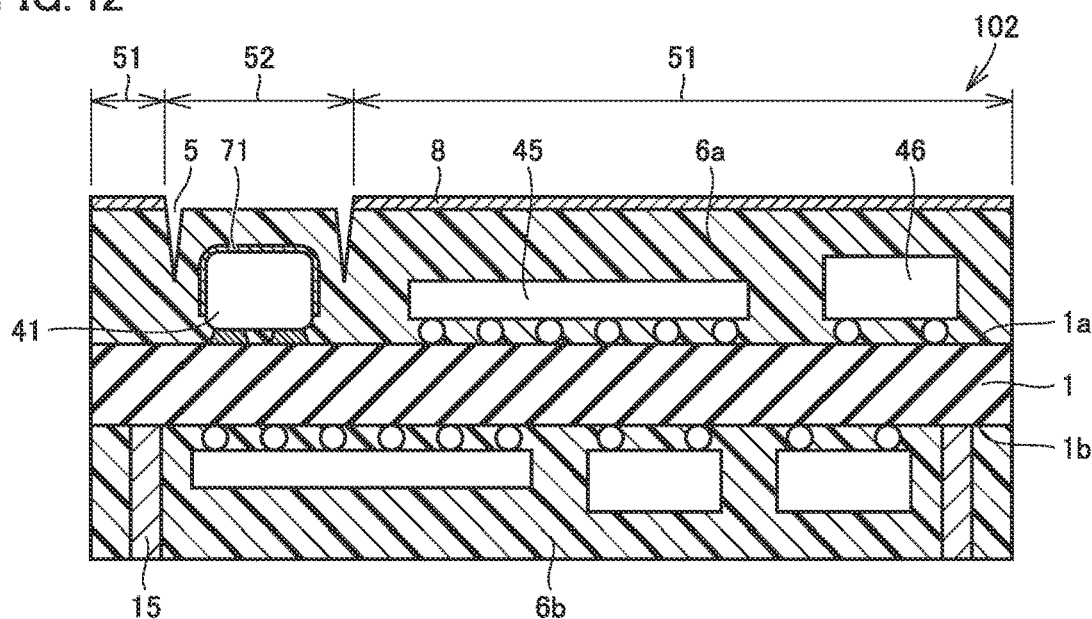
FIG. 12 is a cross-sectional view of a module in a second embodiment based on the present disclosure.

A module in a second embodiment based on the present disclosure will be described with reference to FIG. 12. FIG. 12 shows a module 102 with a double-sided mount structure. In module 102, at least one component is mounted also on second surface 1b of substrate 1. First surface 1a and a component mounted on first surface 1a are covered with a sealing resin 6a. Second surface 1b and a component mounted on second surface 1b are covered with a sealing resin 6b formed separately from sealing resin 6a. An external connection terminal 15 is provided to pass through sealing resin 6b. External connection terminal 15 may be, for example, a columnar conductor and is connected to second surface 1b. External connection terminal 15 has a lower end exposed through sealing resin 6b. External connection terminal 15 may have a lower surface covered with a plated film.

Since the double-sided mount structure is adopted in the present embodiment, a larger number of components can be mounted on substrate 1 limited in area. Therefore, the module can readily be higher in function.

Third Embodiment

Figure 13:
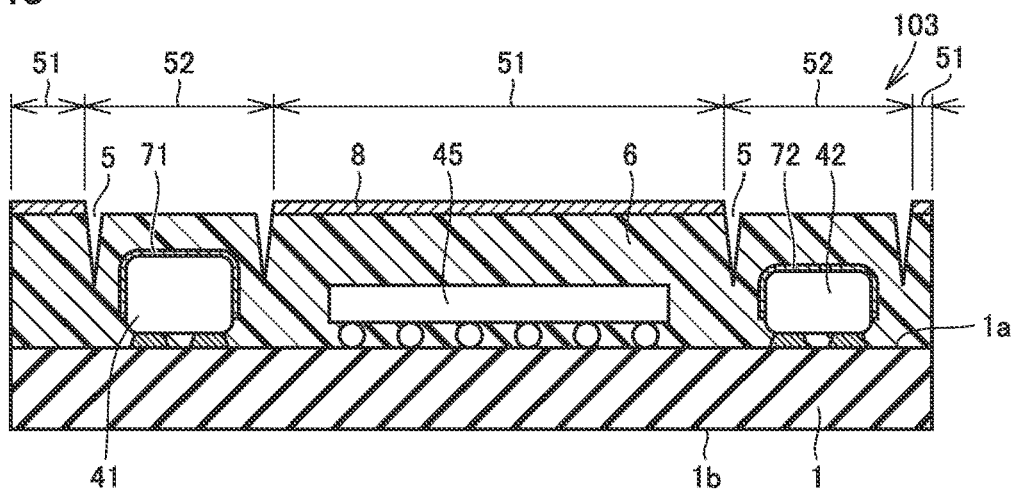
FIG. 13 is a cross-sectional view of a module in a third embodiment based on the present disclosure.

A module in a third embodiment based on the present disclosure will be described with reference to FIG. 13. In a module 103 shown in FIG. 13, a second component 42 in addition to first component 41 is also mounted on first surface 1a of substrate 1. Second component 42 is also a shield-film-equipped electronic component similarly to first component 41. Second component 42 includes a second conductive film 72.

Module 103 includes second component 42. Second component 42 is mounted on first surface 1a. At least a part of a surface of second component 42 on the side distant from substrate 1 is covered with second conductive film 72. When viewed in the direction perpendicular to first surface 1a, at least a part of second conductive film 72 is superimposed on non-shielded region 52.

When the construction is such that a plurality of components each including the conductive film are mounted on first surface 1a of substrate 1 and the problem of the parasitic capacitance is to be solved in each of the plurality of components, non-shielded region 52 may be provided in correspondence with each of the plurality of components as shown in the present embodiment.

In the present embodiment, the problem of the parasitic capacitance can be solved in each of the plurality of components.

Though there is nothing to contribute to shield against electromagnetic waves in a region where non-shielded region 52 is provided, such a construction as shown in the present embodiment is also significant when importance is placed on solution of the problem of the parasitic capacitance.

Fourth Embodiment

Figure 14:
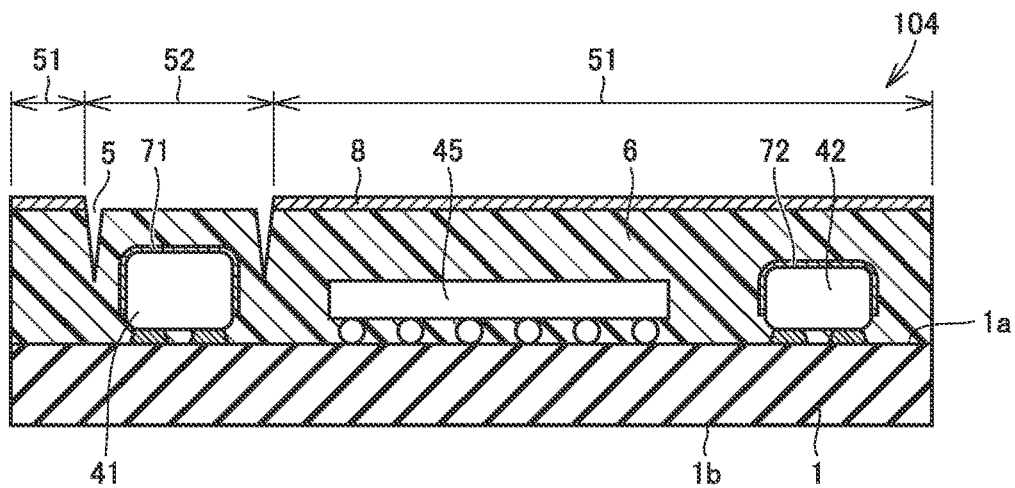
FIG. 14 is a cross-sectional view of a module in a fourth embodiment based on the present disclosure.

A module in a fourth embodiment based on the present disclosure will be described with reference to FIG. 14. In a module 104 shown in FIG. 14, as in module 103, second component 42 is mounted on first surface 1*a* of substrate 1, in addition to first component 41. Second component 42 includes second conductive film 72.

As shown in the present embodiment, module 104 includes second component 42 at least a part of the surface of which on the side distant from substrate 1 is covered with second conductive film 72. Second component 42 is mounted on first surface 1*a*. At least a part of the surface of second component 42 on the side distant from substrate 1 is covered with second conductive film 72. The upper surface of first component 41 is located at a position more distant from first surface 1*a* than an upper surface of second component 42.

When viewed in the direction perpendicular to first surface 1*a*, at least a part of second conductive film 72 is superimposed on shielded region 51.

Since shielded region 51 is superimposed on at least a part of second conductive film 72 of second component 42 in the present embodiment, second component 42 can be shielded against electromagnetic waves.

An unprotected region where there is nothing to contribute to shield against electromagnetic waves can be as small as possible. In the present embodiment where a plurality of components are mounted on first surface 1*a* of substrate 1, non-shielded region 52 is provided to be superimposed on at least a part of first conductive film 71 of first component 41 which is a tall component. At least a part of second conductive film 72 of second component 42, however, is superimposed on shielded region 51. Therefore, the unprotected region can be minimized.

In general, the tallest component among components each including the conductive film tends to suffer from a problem of the parasitic capacitance. In the present embodiment, since non-shielded region 52 is provided only for the region corresponding to the tallest component, the problem of the parasitic capacitance can efficiently be solved.

By arranging a tall shield-equipped component as first component 41 and providing non-shielded region 52 above first component 41, noise that goes out of the module through non-shielded region 52 can be suppressed.

Fifth Embodiment

Figure 15:
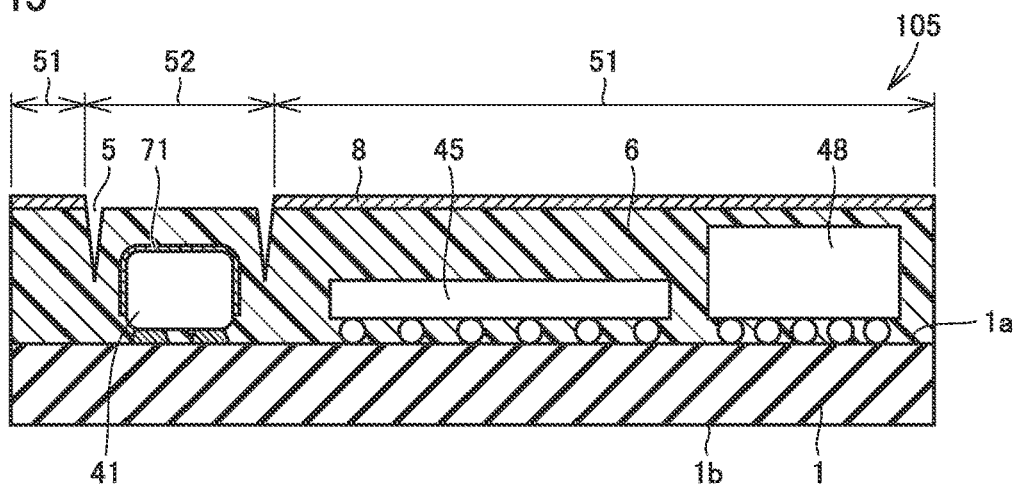
FIG. 15 is a cross-sectional view of a module in a fifth embodiment based on the present disclosure.

A module in a fifth embodiment based on the present disclosure will be described with reference to FIG. 15. In a module 105 shown in FIG. 15, first component 41, component 45, and a component 48 are mounted on first surface 1*a* of substrate 1. An upper surface of component 48 is located at a position more distant than first surface 1*a* than the upper surface of first component 41. In other words, component 48 is taller than first component 41. Component 48, however, is not a shield-equipped component. In such a case, non-shielded region 52 may simply be provided only in the region corresponding to first component 41 which is the shield-equipped portion.

Since non-shielded region 52 is provided only in the region corresponding to first component 41 which is the shield-film-equipped electronic component in the present embodiment, the problem of the parasitic capacitance can efficiently be solved.

Sixth Embodiment

Figure 16:
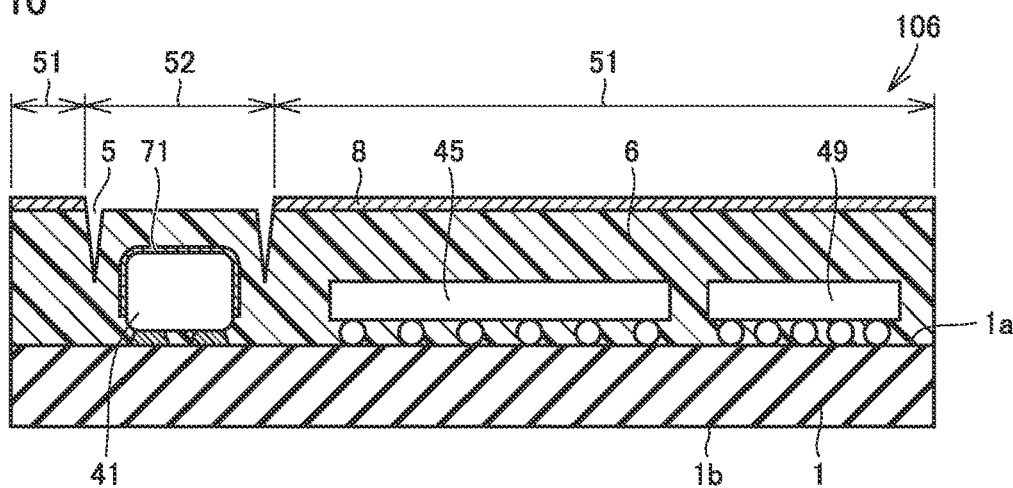
FIG. 16 is a cross-sectional view of a module in a sixth embodiment based on the present disclosure.

A module in a sixth embodiment based on the present disclosure will be described with reference to FIG. 16. In a module 106 shown in FIG. 16, first component 41, component 45, and a component 49 are mounted on first surface 1*a* of substrate 1. An upper surface of component 49 is located at a position closer to first surface 1*a* than the upper surface of first component 41. In other words, component 49 is shorter than first component 41. Component 49 is not a shield-equipped component. In such a case, non-shielded region 52 may simply be provided only in the region corresponding to first component 41 which is the shield-equipped component.

Since non-shielded region 52 is provided only in the region corresponding to first component 41 which is the shield-equipped component in the present embodiment, the problem of the parasitic capacitance can efficiently be solved.

Seventh Embodiment

Figure 17:
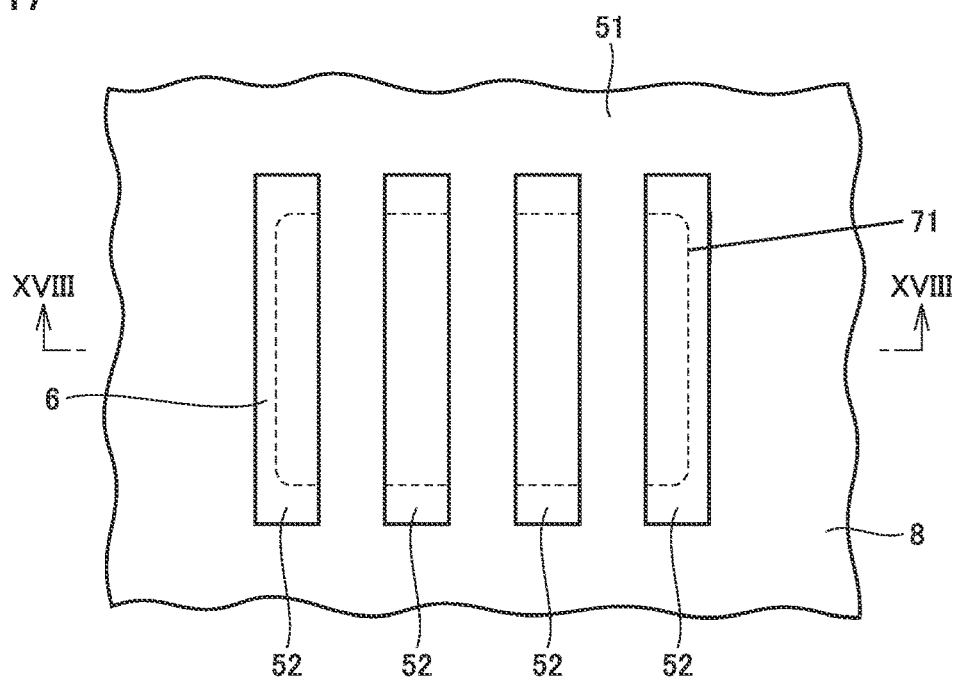
FIG. 17 is a partial plan view of a module in a seventh embodiment based on the present disclosure.
Figure 18:
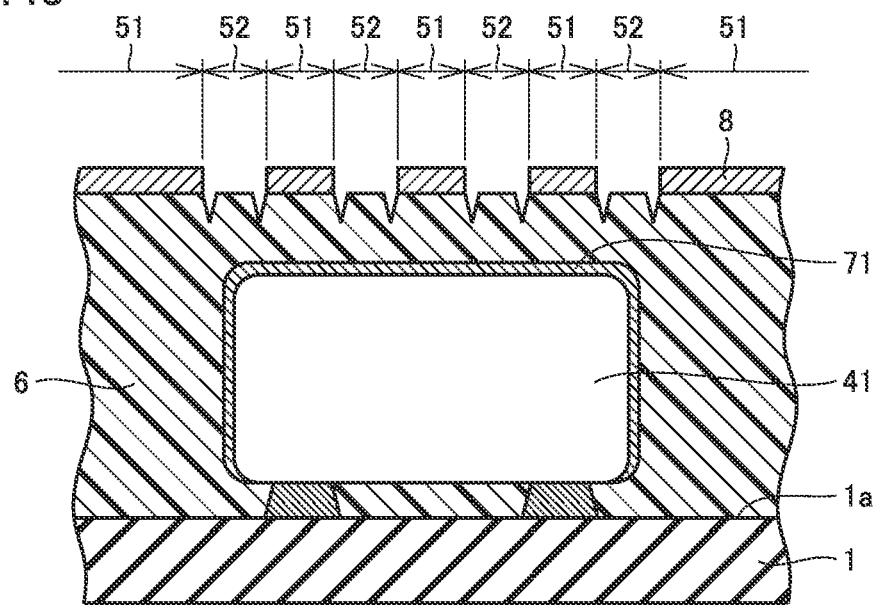
FIG. 18 is a cross-sectional view along the line XVIII-XVIII in FIG. 17.

A module in a seventh embodiment based on the present disclosure will be described with reference to FIGS. 17 to 18. FIG. 17 shows a partial plan view of the module in the present embodiment. FIG. 18 shows a cross-sectional view along the line XVIII-XVIII in FIG. 17.

In the module in the present embodiment, when viewed in the direction perpendicular to first surface 1*a*, at least a part of shield film 8 is meshed or striped. In an example shown in FIGS. 17 and 18, a striped region of shield film 8 is present in correspondence with first conductive film 71 of first component 41. In this case, a region where shield film 8 is present falls under shielded region 51 and each of openings in shield film 8 falls under non-shielded region 52. A plurality of non-shielded regions 52 each in a strip shape is arranged in parallel.

In the present embodiment, a region corresponding to first conductive film 71 is not completely open but shield film 8 in stripes is present in that region. Therefore, electromagnetic waves can be cut off to some extent. Nevertheless, an area over which shield film 8 is present in the region corresponding to first conductive film 71 is smaller than in an example where shield film 8 completely covers the region, and hence occurrence of the parasitic capacitance can be suppressed.

Figure 19:
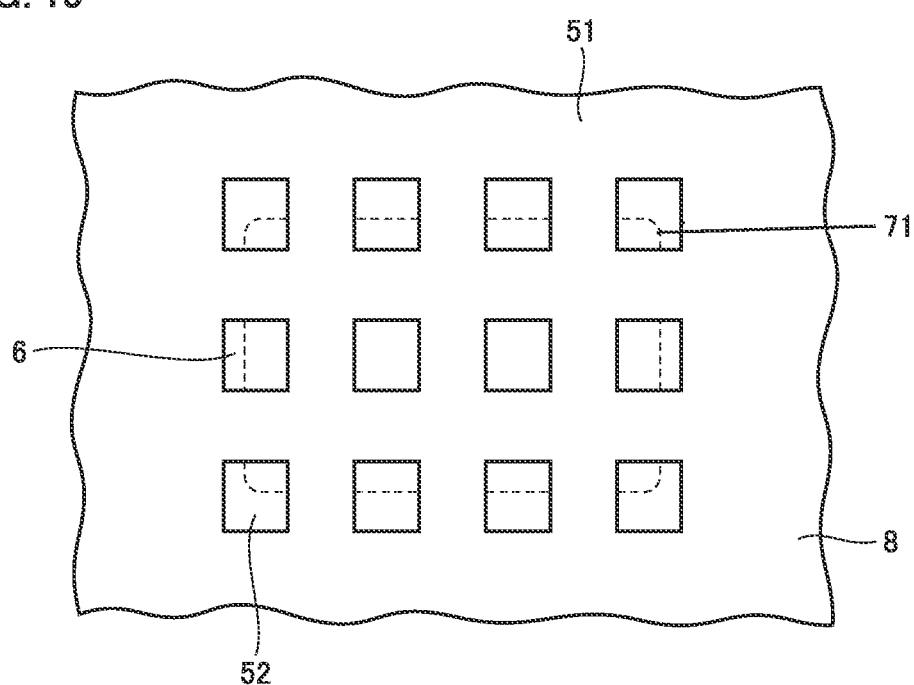
FIG. 19 is a partial plan view of a modification of the module in the seventh embodiment based on the present disclosure.

An example as shown in FIG. 19 may be applicable where at least a part of shield film 8 is meshed instead of being striped. Such a construction may be applicable. A single module may include both of a portion where shield film 8 is striped and a portion where shield film 8 is meshed.

Some features in embodiments above may be adopted as being combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

REFERENCE SIGNS LIST 1 substrate; 1*a* first surface; 1*b* second surface; 5 groove; 6, 6*a*, 6*b* sealing resin; 8 shield film; 9 sheet; 15 external connection terminal; 41 first component; 42 second component; 45, 46, 48, 49 component; 51 shielded region; 52 non-shielded region; 71 first conductive film; 72 second conductive film; 101, 102, 103, 104, 105, 106 module

The invention claimed is:

1. A module comprising:
a substrate including a first surface;
a first component mounted on the first surface, at least a part of a surface of the first component on a side distant from the substrate in a direction perpendicular to the first surface is covered with a first conductive film;
a sealing resin arranged to cover the first surface and the first component; and
a shield film that covers a part of a surface of the sealing resin on the side distant from the substrate in the direction perpendicular to the first surface, wherein
the surface of the sealing resin on the side distant from the substrate includes a shielded region covered with the shield film when viewed in the direction perpendicular to the first surface and a non-shielded region not covered with the shield film, and
the non-shielded region is superimposed on at least a part of the first conductive film when viewed in the direction perpendicular to the first surface.

2. The module according to claim 1, comprising a second component mounted on the first surface, at least a part of a surface of the second component on a side distant from the substrate is covered with a second conductive film, wherein
an upper surface of the first component is located more distant from the first surface than an upper surface of the second component, and
when viewed in the direction perpendicular to the first surface, at least a part of the second conductive film is superimposed on the shielded region.

3. The module according to claim 2, wherein
when viewed in the direction perpendicular to the first surface, at least a part of the shield film is meshed or striped.

4. The module according to claim 2, wherein
the surface of the sealing resin on the side distant from the substrate includes a groove that separates the shielded region and the non-shielded region from each other.

5. The module according to claim 1, comprising a second component mounted on the first surface, at least a part of a surface of the second component on a side distant from the substrate is covered with a second conductive film, wherein
when viewed in the direction perpendicular to the first surface, at least a part of the second conductive film is superimposed on the non-shielded region.

6. The module according to claim 5, wherein
when viewed in the direction perpendicular to the first surface, at least a part of the shield film is meshed or striped.

7. The module according to claim 5, wherein
the surface of the sealing resin on the side distant from the substrate includes a groove that separates the shielded region and the non-shielded region from each other.

8. The module according to claim 1, wherein
when viewed in the direction perpendicular to the first surface, at least a part of the shield film is meshed or striped.

9. The module according to claim 8, wherein
the surface of the sealing resin on the side distant from the substrate includes a groove that separates the shielded region and the non-shielded region from each other.

10. The module according to claim 1, wherein
the surface of the sealing resin on the side distant from the substrate includes a groove that separates the shielded region and the non-shielded region from each other.

11. A method of manufacturing a module comprising:
preparing a substrate assembly including a first surface;
mounting a first component on the first surface;
forming a sealing resin to cover the first surface and the first component;
bonding a sheet to cover a surface of the sealing resin on a side distant from the first surface;
providing a groove in the sealing resin from above the sheet such that the groove surrounds the first component when viewed in a direction perpendicular to the first surface;
removing the sheet in a region other than a region surrounded by the groove;
dividing the substrate assembly and the sealing resin into a size of an individual module;
forming a shield film to cover an upper surface and a side surface of the sealing resin of the size of the individual module; and
removing the sheet from the region surrounded by the groove after the forming the shield film.

* * * * *